US008647806B2

(12) United States Patent
Ueda et al.

(10) Patent No.: US 8,647,806 B2
(45) Date of Patent: Feb. 11, 2014

(54) PHOTOSENSITIVE RESIN COMPOSITION, PHOTOSENSITIVE DRY FILM AND METHOD FOR FORMING PATTERN

(75) Inventors: Akifumi Ueda, Toyohashi (JP); Hidetaka Nakagawara, Toyohashi (JP); Kazuo Watanabe, Koshigaya (JP); Shigeki Watanabe, Koshigaya (JP); Wei Jen Lan, Taoyuan Hsien (TW); Chao Wen Lin, Taoyuan Hsien (TW)

(73) Assignees: Micro Process Inc, Koshigaya-shi (JP); Everlight Chemical Industrial Corporation, Taoyuan Hsien (TW); Mitsubishi Rayon Co., Ltd., Tokyo (JP)

( * ) Notice: Subject to any disclaimer, the term of this patent is extended or adjusted under 35 U.S.C. 154(b) by 0 days.

(21) Appl. No.: 13/519,418

(22) PCT Filed: Dec. 27, 2010

(86) PCT No.: PCT/JP2010/073525
§ 371 (c)(1),
(2), (4) Date: Aug. 9, 2012

(87) PCT Pub. No.: WO2011/081127
PCT Pub. Date: Jul. 7, 2011

(65) Prior Publication Data
US 2012/0301830 A1 Nov. 29, 2012

(30) Foreign Application Priority Data

Dec. 28, 2009 (JP) .................................. 2009-297145

(51) Int. Cl.
*G03F 7/023* (2006.01)
*G03F 7/30* (2006.01)
(52) U.S. Cl.
CPC ............... *G03F 7/0233* (2013.01); *G03F 7/30* (2013.01)
USPC ............ 430/191; 430/192; 430/193; 430/326
(58) Field of Classification Search
CPC ................................. G03F 7/0233; G03F 7/30
USPC .................................. 430/191, 192, 193, 326
See application file for complete search history.

(56) References Cited

U.S. PATENT DOCUMENTS

| 4,950,582 | A | * | 8/1990 | Aoai et al. | .................... | 430/175 |
| 5,338,643 | A | * | 8/1994 | Kanazawa et al. | ............ | 430/190 |
| 5,624,781 | A | | 4/1997 | Naruse et al. | | |

FOREIGN PATENT DOCUMENTS

| CN | 1768302 A | 5/2006 |
| CN | 101121762 A | 2/2008 |
| CN | 101182366 A | 5/2008 |
| JP | 1 280748 | 11/1989 |
| JP | 5 107756 | 4/1993 |
| JP | 5 107757 | 4/1993 |
| JP | 5 224407 | 9/1993 |
| JP | 6-167811 A | 6/1994 |
| JP | 7-133449 | 5/1995 |
| JP | 2003 156843 | 5/2003 |
| JP | 2003 287905 | 10/2003 |
| JP | 2009 282512 | 12/2009 |
| KR | 10-0913058 B1 | 8/2009 |

OTHER PUBLICATIONS

U.S. Appl. No. 13/519,495, filed Aug. 22, 2012, Ueda, et al.
International Search Report Issued Jan. 25, 2011 in PCT/JP10/73525 Filed Dec. 27, 2010.
International Search Report issued Jan. 25, 2011, in PCT/JP2010/073532.
Combined Chinese Office Action and Search Report issued Jul. 2, 2013, in Chinese Patent Application No. 201080061283.0 with partial English translation.
Combined Chinese Office Action and Search Report issued Aug. 2, 2013, in Chinese Patent Application No. 201080064710.0 with partial English translation.

* cited by examiner

Primary Examiner — John Chu
(74) Attorney, Agent, or Firm — Oblon, Spivak, McClelland, Maier & Neustadt, L.L.P.

(57) ABSTRACT

The present invention is related to a photosensitive resin composition containing: a vinyl-based copolymer (I) obtained by polymerizing a monomer mixture containing a monomer (a) having a phenolic hydroxyl group and a carboxyl group-containing vinyl monomer (b); a quinonediazide compound (II) and a compound (III) represented by the following formula (5), and to a photosensitive dry film and a method for forming a patter by using the photosensitive resin composition.
According to the present invention, it is possible to provide a photosensitive resin composition which can form a resist film in which the occurrence of crack is suppressed, the film reduction of the unexposed area is suppressed, and sensitivity and resolution are excellent, and to provide a photosensitive dry film and a method for forming a pattern by using the photosensitive resist composition

[Chemical Formula 1]

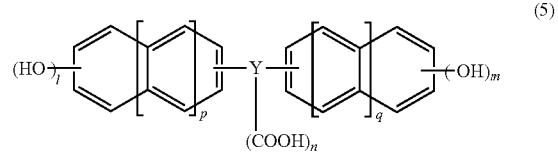

(5)

[In the formula, Y is a straight or branched hydrocarbon group of 1 to 6 carbon atoms; l and m are respectively independently an integer of 1 to 3; n is 1 or 2; p and q are respectively independently 0 or 1.]

7 Claims, No Drawings

PHOTOSENSITIVE RESIN COMPOSITION, PHOTOSENSITIVE DRY FILM AND METHOD FOR FORMING PATTERN

TECHNICAL FIELD

The present invention relates to a photosensitive resin composition, a photosensitive dry film, and a method for forming a pattern using the same.

Priority is claimed on Japanese Patent Application No. 2009-297145, filed Dec. 28, 2009, the content of which is incorporated herein by reference.

BACKGROUND ART

As the process of forming an electronic circuit, a process using a photosensitive resin composition is generally employed.

In the process for forming a circuit using a photosensitive resin composition, through a step of forming a resist film composed of a photosensitive resin composition on the surface of the substrate, a step of irradiating the light to the resist film through a mask to form a latent image, a step of developing the resist film in which a latent image was formed, using a developing solution to form a resist pattern, and a step of chemically etching and plating of the part where resist is not presented, then the electronic circuit is formed.

In addition, in the chip-on-film (COF) in which a bare chip was directly arranged on the flexible substrate and the multilayer printed wiring board obtained by the build-up method, the miniaturization of electronic circuits has been investigated. In the circuit formation process for the COF and the build-up multilayer printed wiring board obtained by the build-up method, at the step corresponding to the development step in the normal printed wiring board, 1% by weight aqueous solution of sodium carbonate is used as a developing solution.

As the conventional photosensitive resin composition, the following is known.

(1) Photosensitive resin composition containing a compound consisting of a novolac resin, a quinonediazide compound, cyclohexanes, and phenols (Patent Document 1).

(2) Photosensitive resin composition containing a vinyl-based polymer having a structural unit derived from a monomer having a phenolic hydroxyl group and a structural unit derived from a vinyl-based monomer containing a carboxyl group, and a quinonediazide compound (Patent Document 2).

(3) Photosensitive resin composition containing a vinyl-based copolymer having a structural unit derived from a vinyl-based monomer containing a carboxyl group, a quinonediazide compound, and a polyhydric phenol compound (Patent Document 3).

However, a novolac resin contained in the photosensitive resin composition of (1) is a brittle resin, and if the photosensitive resin composition containing a novolac resin is used as a resist film, there is a problem that cracks are likely to occur onto the resist film. In particular, if the photosensitive resin composition is made into a dry film, because the dry film is wound, aforementioned problem becomes noticeable.

In addition, in the photosensitive resin composition of (3), because the vinyl-based copolymer does not have a phenolic hydroxyl group, there is no interaction between the phenolic hydroxyl group and a quinonediazide. Therefore, the unexposed area of the resist film is easily dissolved, and is likely to occur the film reduction.

From the background described above, in the circuit formation process in the COF and the multilayer printed wiring board obtained by the build-up method, a photosensitive resin composition which can form a resist film in which the occurrence of cracks is suppressed, the film reduction of an unexposed area is suppressed, and sensitivity and resolution are excellent.

CITATION LIST

Patent Documents

[Patent Document 1] Japanese Unexamined Patent Application, First Publication No. Hei 5-224407

[Patent Document 2] Japanese Unexamined Patent Application, First Publication No. 2003-287905

[Patent Document 3] Japanese Unexamined Patent Application, First Publication No. 2003-156843

SUMMARY OF THE INVENTION

Technical Problem

In the process of circuit formation in the COF and the multilayer printed wiring board obtained by build-up method, the present invention provides a photosensitive resist composition which can form a resist film in which the occurrence of cracks is suppressed, the film reduction of unexposed area is suppressed, and sensitivity and resolution are excellent, and provides a photosensitive dry film, and method for forming a pattern using the same.

Solution to Problem

First embodiment of the present invention is a photosensitive resin composition containing: a vinyl-based copolymer (I) obtained by polymerizing a monomer mixture containing a monomer (a) having a phenolic hydroxyl group and a carboxyl group-containing vinyl monomer (b); a quinonediazide compound (II); and a compound (III) represented by the following formula (5).

[Chemical Formula 1]

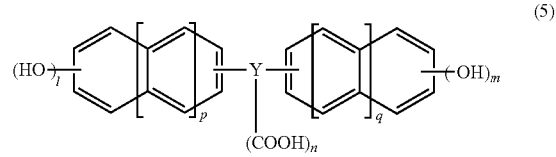

(5)

In the formula, Y is a straight or branched hydrocarbon group of 1 to 6 carbon atoms; l and m are respectively independently an integer of 1 to 3; n is 1 or 2; p and q are respectively independently 0 or 1.

Second embodiment of the present invention is the photosensitive resin composition according to the first embodiment, wherein the compound (III) is at least one compound selected from the group consisting of compounds represented by the following formula (5-1) and (5-2).

[Chemical Formula 2]

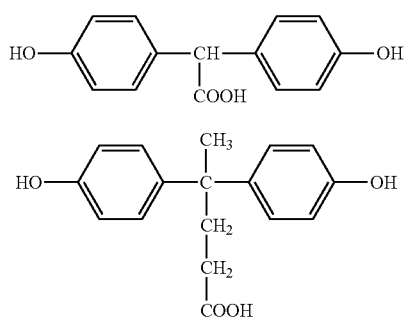

(5-1)
(5-2)

Third embodiment of the present invention is the photosensitive resin composition according to the first embodiment, wherein the content ratio of the compound (II) is 5 to 70 parts by mass, relative to 100 parts by mass of the vinyl-based copolymer (I), and the content ratio of said compound (III) is 0.5 to 10 parts by mass, relative to 100 parts by mass of the vinyl-based copolymer (I).

Fourth embodiment of the present invention is the photosensitive resin composition according to the first embodiment, wherein the quinonediazide compound (II) is an ester compound derived from a aromatic polyhydroxy compound having 1 to 3 aromatic rings, and at least one compound selected from the group consisting of 1,2-naphthoquinonediazide-4-sulfonic acid and 1,2-naphthoquinonediazide-5-sulfonic acid.

Fifth embodiment of the present invention is the photosensitive resin composition according to the fourth embodiment, wherein the quinonediazide compound (II) is an ester compound derived from at least one compound selected from the group consisting of a compound represented by the following formula (4-1), a compound represented by the following formula (4-2), and a compound represented by the following formula (4-3), and at least one compound selected from the group consisting of 1,2-naphthoquinonediazide-5-sulfonic acid and 1,2-naphthoquinone diazide-4-sulfonic acid.

[Chemical Formula 3]

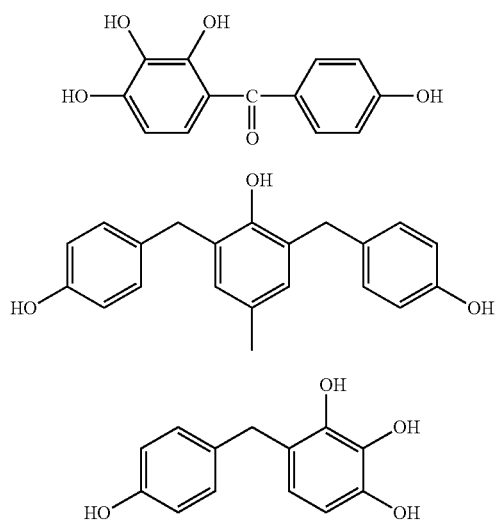

(4-1)
(4-2)
(4-3)

Sixth embodiment of the present invention is a photosensitive dry film composed from the photosensitive resin composition according to any one of the first embodiment to the fifth embodiment on the surface of the support film. Seventh embodiment of the present invention is a method for forming a pattern including: forming a resist film composed of a photosensitive resin composition according to any one of the first embodiment to the fifth embodiment on the surface of the substrate; conducting exposure of the resist film to form a latent image; and developing the resist film in which the latent image is formed, using a developing solution having pH 10.5 to 12.5 to form a resist pattern.

Advantageous Effects of the Invention

According to the photosensitive resin composition of the first embodiment to the fifth embodiment of the present invention, in the process of circuit formation in the COF and the multilayer printed wiring board obtained by build-up method, it is possible to form a resist film in which the occurrence of cracks is suppressed, the film reduction of the unexposed area is suppressed, and sensitivity and resolution are excellent.

According to the photosensitive dry film of the sixth embodiment of the present invention, in the process of circuit formation in the COF and the multilayer printed wiring board obtained by build-up method, it is possible to form a resist film in which the occurrence of cracks is suppressed, the film reduction of unexposed area is suppressed, and sensitivity and resolution are excellent.

According to the method for forming a pattern of the seventh embodiment of the present invention, in the process of circuit formation in the COF and the multilayer printed wiring board obtained by the build-up method, it is possible to form a fine pattern with high accuracy and fewer defects.

DETAILED DESCRIPTION OF THE INVENTION

In the present specification, the term "(meth)acrylic acid" means acrylic acid or methacrylic acid, and the term "(meth)acryloyl" means acryloyl or methacryloyl.

In addition, in the present specification, the term "monomer" means a polymerizable compound having a carbon-carbon double bond.

<Photosensitive Resin Composition>

The photosensitive resin composition of the present invention includes a vinyl-based copolymer (I), a quinonediazide compound (II), a specific compound (III), and as necessary the other components.

(Vinyl-Based Copolymer (I))

A vinyl-based copolymer (I) can be obtained by polymerization with a monomer (a) having a phenolic hydroxyl group, a carboxyl group-containing vinyl monomer (b), and as necessary an other vinyl-based monomer (c) which can polymerize with them.

A monomer (a) having a phenolic hydroxyl group (thereafter, also simply referred to as monomer (a)) is a monomer having one or more aromatic rings, in which one or more hydrogen atoms of the aromatic ring are substituted by hydroxyl groups.

As a monomer (a), a monomer (a1) represented by the following formula (1), a monomer (a2) represented by the following formula (2), and a monomer (a3) represented by the following formula (3) are preferable.

[Chemical Formula 4]

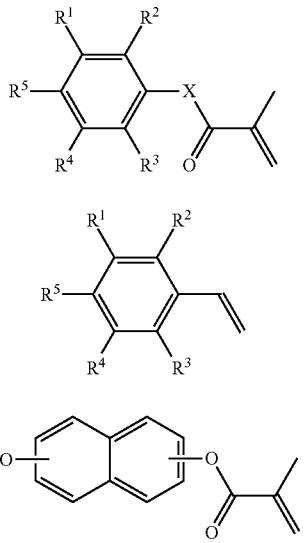

$R^1$ to $R^5$ are respectively independently a hydrogen atom, a hydroxyl group, an alkyl group of 1 to 24 carbon atoms, an aryl group of 1 to 24, or an aralkyl group of 1 to 24, provided that at least one of $R^1$ to $R^5$ is a hydroxyl group. As $R^1$ to $R^5$ except for the hydroxyl group, a hydrogen atom, and an alkyl group of 1 to 24 carbon atoms are preferred. A hydrogen atom is more preferable for reasons of availability.

X is an oxygen atom or NH.

As a monomer (a1), a monomer (a1-1) represented by the following formula (1-1), or a monomer (a1-2) represented by the following formula (1-2) is preferable for reasons of availability.

In addition, as a monomer (a2), a monomer (a2-1) represented by the following formula (2-1) is preferable for reasons of availability.

In addition, as a monomer (a3), a monomer (a3-1) represented by the following formula (3-1) is preferable for reasons of availability.

[Chemical Formula 5]

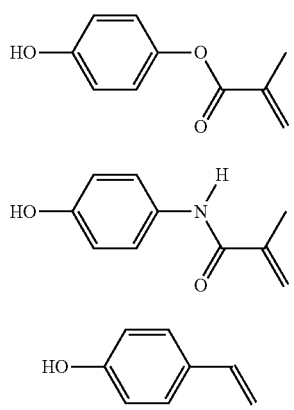

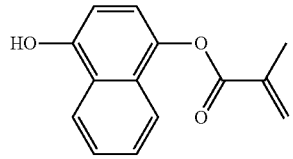

Examples of the carboxyl group-containing vinyl-based monomer (b) (hereafter, also simply referred to as monomer (b)) include (meth)acrylic acid, itaconic acid, itaconic acid monoester, fumaric acid, fumaric acid monoester, maleic acid, maleic acid monoester, 2-(meth)acryloyloxyethyl phthalic acid, 2-(meth)acryloyloxyethylhexahydrophthalic acid, and the like. Of these, (meth)acrylic acid is preferred.

Examples of the other vinyl-based monomer (c) (hereafter, also simply referred to as monomer (c)) include (meth)acrylic acid esters which is other than monomers (a) and (b), acrylamide, methacrylamide, acrylonitrile, methacrylonitrile, styrenes (such as styrene, methylstyrene, chlorostyrene, and the like), and the like.

Examples of (meth)acrylic acid esters include methyl (meth)acrylate, ethyl(meth)acrylate, n-propyl(meth)acrylate, i-propyl(meth)acrylate, n-butyl(meth)acrylate, sec-butyl (meth)acrylate, tert-butyl(meth)acrylate, 2-ethylhexyl(meth) acrylate, phenyl(meth)acrylate, isobornyl(meth)acrylate, hydroxymethyl(meth)acrylate, hydroxyethyl(meth)acrylate, hydroxypropyl(meth)acrylate, and the like. Among them, methyl(meth)acrylate, ethyl(meth)acrylate, and styrene are preferred.

A vinyl-based copolymer (I) can be prepared by known polymerization methods such as solution polymerization method, suspension polymerization method, emulsion polymerization method or the like. As a polymerization method, from the point of less impurities such as emulsifying agents, a solution polymerization method and a suspension polymerization method are preferred.

For example, a vinyl-based copolymer can be obtained by a known radical polymerization such as solution polymerization method, in which in the presence of an organic solvent heated to about 60 to 120° C. in the polymerization vessel, a monomer mixture in which monomers and a radical polymerization initiator such as azobisisobutyronitrile (AIBN) are dissolved is added dropwise over several hours, and then polymerization is conducted. A monomer (a), a monomer (b), and a monomer (c) may be mixed and then supplied to the polymerization vessel in order to polymerization, or may be respectly separately supplied to the polymerization vessel, or mixture of any two monomers and other one monomer may be separately supplied to the polymerization vessel.

The weight average molecular weight (Mw) (polystyrene equivalent value as measured by gel permeation chromatography) of the vinyl-based copolymer (I) is not particularly limited, and is preferably from 5,000 to 80,000, more preferably from 6,000 to 30,000, and most preferably 7,000 to 15,000. If the weight average molecular weight is less than or equal to the upper limit of this range, the compatibility with other formulations such as a photosensitive agent can be maintained. If the weight average molecular weight is greater than or equal to the lower limit of this range, the durability of the coating film can be maintained.

The amount of the monomer (a) is preferably 5 to 80 mol %, relative to the total amount of crude monomers (a) to (c) as high as 100 mol %, more preferably 10 to 60 mol %, and especially preferably 30 to 60 mol %. If the amount of the monomer (a) is more than or equal to 5%, the resolution of the resist film can be sufficiently increased, and the film reduction of the unexposed area of the resist film can be sufficiently suppressed. If the amount of the monomer (a) is less than or equal to 80 mol %, the occurrence of cracks on the resist film can be sufficiently suppressed.

The amount of the structural units derived from the monomer (a) is preferably from 10 to 60 mol % and more preferably from 20 to 50 mol %, relative to the total amount of all the structural units which compose the vinyl-based copolymer (I). If the amount of the structural units derived from the monomer (a) is more than or equal to 10 mol %, the resolution of the resist film can be sufficiently increased, and the film reduction of the unexposed area of the resist film can be sufficiently suppressed. If the amount of structural units derived from the monomer (a) is less than or equal to 50 mol %, the occurrence of cracks on the resist film can be sufficiently suppressed.

The amount of the monomer (b) is preferably 1 to 50 mol % and more preferably 5 to 40 mol %, relative to the total amount of crude monomers (a) to (c) as high as 100 mol %. If the amount of the monomer (b) is more than or equal to 1 mol %, the resolution of the resist film can be sufficiently increased. If the amount of the monomer (b) is less than or equal to 50 mol %, the film reduction of the unexposed area of the resist film can be sufficiently suppressed, and the occurrence of cracks on the resist film can be sufficiently suppressed.

The amount of structural units derived from the monomer (b) is preferable 5 to 30 mol % and more preferable 10 to 20 mol %, relative to the total amount of all the structural units which compose the vinyl-based copolymer (I). If the amount of structural units derived from the monomer (b) is more than or equal to 5 mol %, the resolution of the resist film can be increased sufficiently. If the amount of structural units derived from the monomer (b) is less than or equal to 30 mol %, the film reduction of the unexposed area of the resist film can be sufficiently suppressed, and the occurrence of cracks on the resist film can be sufficiently suppressed.

A monomer (c) is used as necessary for the following purposes:
(i) to improve the polymerization between the monomer (a) and monomer (b);
(ii) to suppress the occurrence of cracks, when only the combination of a monomer (a) and a monomer (b) can not obtain an sufficient performance such as the flexibility as a dry film.

The amount of the monomer (c) is preferably 0 to 80 mol % and more preferably 10 to 70 mol %, relative to the total amount of crude monomers (a) to (c) as high as 100 mol %. If the amount of the monomer (c) is more than or equal to 10 mol %, the occurrence of cracks on the resist film can be sufficiently suppressed. If the amount of the monomer (c) is less than or equal to 70 mol %, the resolution of the resist film can be sufficiently increased.

The amount of structural units derived from the monomer (c) is preferably 20 to 80 mol % and more preferably 30 to 60 mol %, relative to the total amount of all the structural units which compose the vinyl-based copolymer (I). If the amount of structural units derived from the monomer (c) is more than or equal to 20 mol %, the occurrence of cracks on the resist film can be sufficiently suppressed. If the amount of structural units derived from the monomer (c) is less than or equal to 80 mol %, the resolution of the resist film can be sufficiently increased.

(Quinonediazide Compound (II))

Examples of the quinonediazide compound (II) include known 1,2-quinonediazide-4-sulfonic acid ester compound, 1,2-quinonediazide-5-sulfonic acid ester compound, 1,2-quinonediazide-6-sulfonic acid ester compound, 1,2-quinonediazide-7-sulfonic acid ester compound, 1,2-quinonediazide-8-sulfonic acid ester compound. In particular, ester compounds derived from 1,2-naphtoquinonediazide sulfonic acid and trihydroxybenzophenones, ester compounds derived from 1,2-naphtoquinonediazide sulfonic acid and tetrahydroxybenzophenones, ester compounds derived from 1,2-naphtoquinonediazide sulfonic acid and pentahydroxybenzophenones, ester compounds derived from 1,2-naphtoquinonediazide sulfonic acid and hexahydroxybenzophenones, and ester compounds derived from 1,2-naphtoquinonediazide sulfonic acid and (polyhydroxy)alkanes.

As the quinonediazide compound (II), an ester compound derived from a aromatic polyhydroxy compound having 1 to 3 aromatic ring and at least one compound selected from the group consisting of 1,2-naphtoquinonediazide-5-sulfonic acid and 1,2-naphthoquinonediazide-4-sulfonic acid is preferable. In particular, an ester compound derived from at least one compound selected from the group consisting of a compound represented by the following formula (4-1), a compound represented by the following formula (4-2), and a compound represented by the following formula (4-3) and at least one compound selected from the group consisting of 1,2-naphthoquinonediazide-5-sulfonic acid and 1,2-naphthoquinonediazide-4-sulfonic acid is especially preferable.

[Chemical Formula 6]

(4-1)

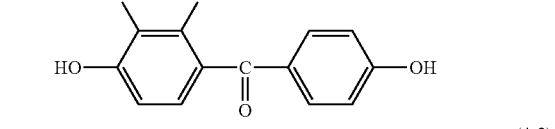

(4-2)

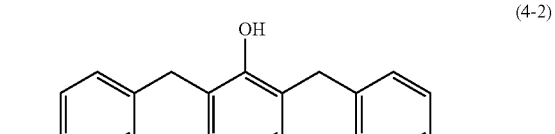

(4-3)

The content ratio of quinonediazide compound (II) is preferably 5 to 70 parts by mass and more preferably 5 to 60 parts by mass, respect to 100 parts by mass of the vinyl-based copolymer (I). If the content ratio of the quinonediazide compound (II) is more than or equal to 5 parts by mass, the film reduction of the unexposed area of the resist film can be sufficiently suppressed, and the occurrence of cracks on the resist film can be sufficiently suppressed. If the content ratio of the quinonediazide compound (II) is less than or equal to 70 parts by mass, the resolution of the resist film can be sufficiently increased.

(Compound (III))

The compound (III) is a compound represented by the following formula (5), and is a component for improving the alkali dissolution rate of the resist film, and thereby improving the resolution of the resist film.

[Chemical Formula 7]

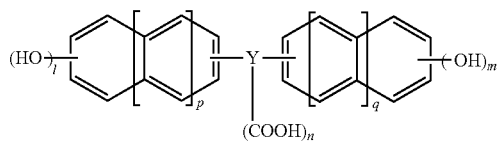

(5)

Y is a linear or branched hydrocarbon group of 1 to 6 carbon atoms. From the point of the resolution of the resist film, an alkanetriyl group of 1 to 3 carbon atoms is preferred.

l and m are respectively independently an integer of 1 to 3. From the point of the resolution of the resist film, 1 or 2 is preferred.

n is 1 or 2. From the point of the resolution of the resist film, 1 is preferred. p and q are respectively independently 0 or 1. From the point of the resolution of the resist film, 0 is preferred.

The compound (III), for example, can be prepared in the following method.

Vilsmeier reaction is conducted between the compound represented by the following formula (5-a) (In the formula, l and p have the same meaning as above) and phosphorus oxychloride in amides (for example, N,N-dimethylformamide and the like). After the resulting reaction mixture is reacted to sodium cyanide, and hydrolyzed in the presence of acid or alkali, and then the compound represented by the following formula (5-b) (in the formula, l, n, p and Y have the same meaning as above) can be obtained. Next, the compound (III) can be provided by condensation between the resulting compound and the compound represented by the following formula (5-c) (in the formula, m and q have the same meaning as above) in the presence of acid catalyst (such as hydrochloric acid).

[Chemical Formula 8]

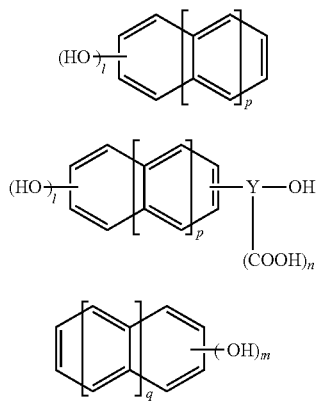

As the compound (III), at least one compound selected from the group consisting of compounds represented by the following formula (5-1) and (5-2) is especially preferable, from the point of the resolution of the resist film.

[Chemical Formula 9]

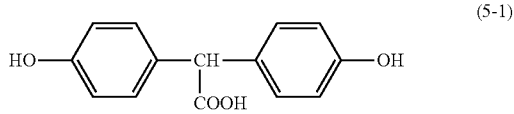

(5-1)

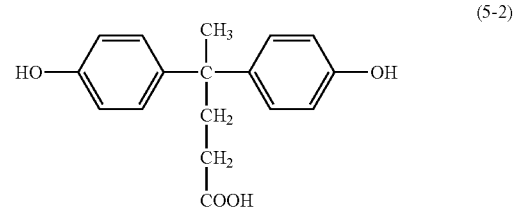

(5-2)

The content ratio of compound (III) is preferably 0.5 to 10 parts by mass, more preferably 1 to 5 parts by mass, and further preferable 2 to 4 parts by mass, relative to 100 parts by mass of the vinyl-based copolymer (I). If the content ratio of compound (III) is more than or equal to 0.5 parts by mass, the alkali dissolution rate of the resist film becomes sufficiently high. If the content ratio of compound (III) is less than or equal to 10 parts by mass, the film reduction of the unexposed area of the resist film can be sufficiently suppressed.

(Other Components)

Examples of the other components include an alkali-soluble resin which does not belong to the vinyl-based copolymer (I), a leveling agents, a storage stabilizer, a plasticizer, an absorption agents, a crosslinking agents, an adhesion auxiliary agent, and the like.

Examples of the alkali-soluble resin include a poly(meth)acrylic acid, a copolymer of (meth)acrylic acid and (meth)acrylate, a novolac resin, and the like.

The content ratio of other components is preferably 0 to 30% by mass, relative to 100% by mass of the solid content of the photosensitive resin composition.

(Dry Film)

The photosensitive resin composition of the present invention is usually used after forming a dry film.

The dry film, for example, is produced by applying an after-mentioned resist solution on the surface of the support film, and drying them to form a resist film, and laminating a protective film on top of the resist film.

The thickness of the resist film is preferably 3 μm or more, from the point of the usefulness as a dry film.

Examples of the material of the supporting film include polyethylene terephthalate (hereinafter, referred to as PET), aromatic polyamide, polyimide, polymethyl pentene, polyethylene, polypropylene and the like. From the point of view of cost and characteristics of the dry film, PET is preferred.

As the material of the protective film, polyethylene and polypropylene are preferred.

(Resist Solution)

The photosensitive resin composition of the present invention may be used in a condition of a resist solution dissolved in a solvent. The resist solution can be provided by a method of mixing a vinyl-based copolymer (I), a quinonediazide compound (II), a specific compound (III), and a solvent; a method of adding a quinonediazide compound (II) and a specific compound (III) to a solution containing a vinyl-based copolymer (I) obtained by the solution polymerization method or suspension polymerization method.

As the solvent, for example, the following compounds may be mentioned.

Ketones: linear or branched ketones such as acetone, methyl ethyl ketone (hereinafter, referred to as MEK), methyl isobutyl ketone, 2-pentanone, 2-hexanone; cyclic ketones such as cyclopentanone, cyclohexanone, and the like.

Propylene glycol monoalkyl acetates: propylene glycol monomethylether acetate (hereinafter, referred to as PGMEA), propylene glycol monomethylether acetate, and the like.

Ethylene glycol monoalkylether acetates: ethylene glycol monomethylether acetate, ethylene glycol monoethylether acetate, and the like.

Propylene glycol monoalkylethers: propylene glycol monomethylether, propylene glycol monoethylether, and the like.

Ethylene glycol monoalkylethers: ethylene glycol monomethylether, ethylene glycol monoethylether, and the like.

Diethylene glycol alkylethers: diethylene glycol dimethylether, diethylene glycol monomethylether, and the like.

Esters: ethyl acetate, ethyl lactate, and the like.

Alcohols: methyl alcohol, ethyl alcohol, n-propyl alcohol, isopropyl alcohol, n-butyl alcohol, cyclohexanol, 1-octanol, and the like.

Others: 1,4-dioxane, ethylene carbonate, γ-butyrolactone, and the like.

Aliphatic hydrocarbon solvents of 5 to 11 carbon atoms: pentane, 2-methylbutane, n-hexane, 2-methylpentane, 2,2-dibutylbutane, 2,3-dibutylbutane, n-heptane, n-octane, isooctane, 2,2,3-trimethylpentane, n-nonane, 2,2,5-trimethylhexane, n-decane, n-dodecane, and the like.

As a solvent, a single type of solvent may be used alone or two or more types of solvents may be used in combination.

As the solvent, from the point of safety and versatile usage, acetone, methyl alcohol, ethyl alcohol, isopropyl alcohol, MEK, PGMEA, ethyl lactate, cyclohexanone, and γ-butyrolactone are preferable. When a photosensitive resin composition is used after forming a dry film, acetone, MEK, methyl alcohol, ethyl alcohol, and isopropyl alcohol are preferred, since boiling point of these solvents is not so high.

The solid concentration of the resist solution is preferably 50% by weight or less, more preferably 40% by mass or less, and especially preferably 35 mass % or less from the point of the viscosity of the resist solution. The solid concentration of the resist solution is preferably 2% by mass or more, more preferably 5% by mass or more, and especially preferably 8% by mass or more, from the point of the productivity of vinyl-based copolymer (I).

The photosensitive resin composition of the present invention described above, because it contains the vinyl-based copolymer (I) instead of the conventional novolac resin, it is possible to form a resist film in which cracks are less likely to occur. In addition, since the vinyl-based copolymer (I) has a structural unit derived from a monomer (a) having a phenolic hydroxyl group and a structural unit derived from a carboxyl group-containing vinyl-based monomer (b), it is possible to form a resist film in which the film reduction of unexposed area is less likely to occur, and the sensitivity and the resolution thereof are excellent. Further, because it contains a specific compound (III), the resolution of the resist film can be further improved.

<Method for Forming a Pattern>

The method for forming a pattern of the present invention is a method including the following steps:

(A) forming a resist film composed of a photosensitive resin composition on the surface of the substrate;

(B) conducting exposure of the resist film to form a latent image;

(C) developing the resist film in which a latent image is formed using a developing solution having pH 10.5 to 12.5 to form a resist pattern; and (D) processing the part where the resist is not present and forming an intended resist pattern on the surface of the substrate (Step (A))

When using a resist solution described above, the resist solution is applied onto the surface of the substrate using a spinner or a coater, and dried, and then a resist film is formed on the surface of the substrate.

In the case of using the aforementioned dry film, the dry film is laminated on the surface of the substrate so that the substrate on which a resist pattern will be formed can contact with the resist film.

(Step (B))

As a method of exposure, examples include ultraviolet exposure method, visible light exposure method, and the like.

As a method for selective exposure, examples include a method using a photomask, a scanning exposure method using a laser beam, and the like. As a method of exposure in the case of using a photo-mask, both a contact exposure method and an off contact exposure method can be used.

In the case of using aforementioned dry film, after exposure of the resist film through the supporting film to form a latent image, the support film is peeled.

(Step (C))

As a developing solution, the aqueous solution of alkali, and the like can be mentioned.

As alkalis, the inorganic alkalis (sodium hydroxide, potassium hydroxide, sodium carbonate, sodium silicate, sodium metasilicate, ammonia water, and the like), primary amines (ethylamine, n-propylamine, and the like), secondary amines (diethylamine, di-n-butylamine, and the like), tertiary amines (triethylamine, methyldiethylamine, and the like), alcohol amines (dimethylethanolamine, triethanolamine, and the like), quaternary ammonium salts (tetramethylammonium hydroxide, tetraethylammonium hydroxide, choline hydroxide, and the like), and cyclic amines (pyrrole, piperidine, and the like).

In an aqueous solution of alkalis, an appropriate amount of alcohols, surfactants, hydroxyl group-containing aromatic compounds, and the like may be added The pH of the developing solution is 10.5 to 12.5, and 11.0 to 12.0 is preferred. If the pH is 10.5 or more, the resolution of the resist film becomes sufficiently high. If the pH is 12.5 or less, the film reduction at unexposed are of resist film is sufficiently suppressed.

If 1% by mass of sodium carbonate aqueous solution (the pH is approximately 11.6) is used, it is especially preferred, because the same process as the general process of circuit formation in printed wiring boards can be used.

(Step (D))

As the processing method, known etching, plating, and the like can be mentioned.

EXAMPLES

Hereinafter, the present invention is specifically described by examples.

The evaluation methods in the examples are as follows.

(Weight Average Molecular Weight)

Using GPC manufactured by Tosoh Corporation, the weight average molecular weight (Mw) of the vinyl-based polymer was measured. The measurement was conducted using three columns of Shodex GPC K-805L manufactured by Showa Denko KK arranged in-line as a separation column, using tetrahydrofuran as a solvent (flow rate: 1.0 mL/minute), using a differential refractometer as a detector, and using polystyrene as standard polymer, and under 40° C. of measurement temperature, with 0.1 mL of injection volume.
(Surface Condition)

The dry film was folded along the outer circumference of the cylinder having 10 cm diameter, the occurrence of cracks was visually observed and evaluated according to the following criteria.

A: no cracks occurred.
B: cracks occurred.
(Film Reduction of Unexposed Area)

The dry film was not exposed and then the film reduction after immersion in 1% by mass of aqueous solution of sodium carbonate (the pH is approximately 11.6) for 1 minute was measured, and evaluated according to the following criteria.

A: Film reduction was less than 10% by mass.
B: Film reduction was less than 20% by mass and 10% by mass or more.
C: Film reduction was less than 30% by mass and 20% by mass or more.
D: Film reduction was 30% by mass or more.
(Sensitivity)

The resist film was exposed with an ultra-high pressure mercury lamp to form a line and space patterns of 10 μm, and the sensitivity was evaluated according to the following criteria when development was conducted for 2 minutes using 1% by mass of aqueous solution of sodium carbonate (the pH was approximately 11.6).

A: The sensitivity was under 100 mJ/cm$^2$.
B: The sensitivity was 100 to 200 mJ/cm$^2$.
C: The sensitivity was over 200 mJ/cm$^2$.
(Resolution)

The resist film was exposed with an ultra-high pressure mercury lamp to form a line and space patterns of 10 μm. After development was conducted for 2 minutes using 1% by mass of aqueous solution of sodium carbonate (pH was approximately 11.6). Then the pattern shape was observed using an electron microscope and evaluated according to the following criteria.

A: Exposed area had been completely dissolved.
B: Some residues were remained on the edge of the pattern.
C: Some residues were remained on the exposed area.
D: Many residues were remained on the exposed area Production Example 1

To a flask equipped with a nitrogen inlet, a stirrer, a condenser, a dropping funnel, and a thermometer, 40 parts by mass of MEK were added under a nitrogen atmosphere. The internal temperature was raised to 80° C. while stirring inside of the flask.

Then, the following mixture (hereinafter, referred to as dropping solution) was added dropwise into the flask using a dropping funnel over a period of 6 hours, and further held the temperature of 80° C. for 1 hour.

The dropping solution including: 40 mol % of monomer (a2-1) (para-hydroxystyrene) represented by the aforementioned formula (2-1); 15 mol % of methacrylic acid (monomer (b)); 20 mol % of methyl methacrylate (monomer (c)); 10 mol % of styrene (monomer (c)); 15 mol % of ethyl acrylate (monomer (c)); 7 parts by mass of a polymerization initiator (manufactured by Otsuka Chemical, 2,2'-azobis 2-methyl butyronitrile), relative to the total of the monomers as high as 100 parts by mass; and 100 parts by mass of MEK.

After holding for one hour, a dropping solution containing of 10 parts by mass of MEK and 1 part by mass of 2,2'-azobis 2-methylbutyronitrile was further added dropwise into the flask over 60 minutes, then kept it for 3 hours at 80° C., and then the solution of a vinyl-based copolymer (I-1) was obtained.

Synthesis Examples 2 to 4

Each solution of the vinyl-based copolymer (I-2) to (I-4) was obtained in the same manner of Synthesis Example 1, except that the amounts of each crude monomer were changed as shown in Table 1.

TABLE 1

| Vinyl-based copolymer | monomer (mol %) | | | | | | Weight average molecular weight (Mw) |
|---|---|---|---|---|---|---|---|
| | (a) | | | (c) | | | |
| | monomer (a1-1) | monomer (a1-2) | (b) MAA | MMA | St | EA | |
| (I-1) | — | 40 | 15 | 20 | 10 | 15 | 8,500 |
| (I-2) | 40 | — | 15 | 20 | 10 | 15 | 9,000 |
| (I-3) | — | — | 15 | 52 | 15 | 18 | 9,200 |
| (I-4) | — | 30 | — | 37 | 15 | 18 | 8,300 |

In the table, the monomer (a1-1) is the monomer represented by the aforementioned formula (1-1) (manufactured by Osaka Organic Chemical Industry Ltd.), the monomer (a2-1) is the aforementioned monomer represented by the formula (2-1) (that is, para-hydroxystyrene), MAA is methacrylic acid, MMA is methyl methacrylate, St is styrene, and EA is ethyl acrylate.

[Synthesis Example of Compound (III)]
Synthesis of Compound (5-1)

A mixture of 16.8 parts by mass of 4-hydroxy mandelic acid, 37.6 parts by mass of phenol, and 170 parts by mass of 10% HCl was reacted for 2 hours at a temperature of 60 to 65° C. After the reaction was completed, a mixture of 300 parts by mass of ion-exchanged water and 300 parts by mass of acetone was added thereto and separated into a water layer and an organic layer at 60° C. Obtained organic layer was washed with ion-exchanged water. The washed organic layer was concentrated under reduced pressure, and then the obtained residue was recrystallized from a mixture of 5 parts by mass of acetone and 80 parts by mass of toluene. Then the compound (III) represented by the formula (5-2) was obtained. From $^1$H-NMR and IR, it was confirmed that the desired compound had been obtained.

Synthesis of Compound (5-2)

A mixture of 94 parts by mass of phenol, 58 parts by mass of levulinic acid, 45 parts by mass of water and 180 parts by mass of concentrated sulfuric acid was reacted for 20 hours at 20° C. After the reaction was completed, a mixture of 300 parts by mass of ion-exchanged water and 300 parts by mass of ethyl acetate was added thereto and separated into a water layer and an organic layer. Sodium bicarbonate aqueous solution was added to the obtained organic layer, and the organic layer was extracted. The extract of sodium bicarbonate aqueous solution was acidified, extracted with ether, and evaporated under vacuum condition, and then a specific compound (III) represented by the formula (5-2). From $^1$H-NMR and IR, it was confirmed that the desired compound had been obtained.

Example 13

100 parts by mass of the vinyl-based copolymer solution (I-1), 10 parts by mass of an ester compound derived from a compound represented by formula (4-1) (1 mol) and 1,2-naphthoquinonediazide-5-sulfonic acid (3 mol) as a quinonediazide compound (II), 2 parts by mass of the compound represented by the formula (5-1) as a specific compound (III), and 200 parts by mass of MEK were mixed, and thereby a resist solution was obtained (solid content is 17.3% by mass).

On a copper laminated plate, the resist solution was applied using a wire bar so that the thickness after drying the resist solution became 5 μm, and dried and then a resist film was formed. The resist film was evaluated. The results are shown in Table 3.

The resist solution was applied on the surface of PET film having a thickness of 15 μm so that the thickness of the resist film became 5 μm, dried, and then a dry film was obtained.

On a copper laminated plate, the dry film was laminated and then a resist film was formed. The dry film was evaluated. The results are shown in Table 3.

Examples 2 to 9, Comparative Examples 1 to 3

The dry films were obtained in the same manner of Example 1, except that the type and amount of the solution of the vinyl-based copolymer (I), the quinonediazide compound (II), and the specific compound (III) were changed as shown in Table 2. In addition, the concentrations of the solid content of the resist solution were respectively 17.3% by mass in Examples 2, 3, and 7 to 9, and Comparative Examples 2 and 3, 17.0% by mass in Example 4, 18.1% by mass in Example 5, and 19.3% by mass in Example 6.

The dry film was evaluated. The results are shown in Table 3.

Comparative Example 4

A dry film was obtained in the same manner of Example 1, expect that the solution of the vinyl-based copolymer (1-1) was changed to a novolac resin.

The dry film was evaluated. The results are shown in Table 3.

In the table, the compound (II-1) is an ester compound derived from a compound represented by the formula (4-1) (1 mol) and 1,2-naphthoquinonediazide-5-sulfonic acid (3 mol), the compound (II-2) is an ester compound derived from a compound represented by the formula (4-2) (1 mol) and 1,2-naphotoquinonediazide-5-sulfonic acid (2 mol), the compound (II-3) is an ester compound derived from the compound represented by the formula (4-3) (1 mol) and 1,2-naphtoquinonediadide-5-sulfonic acid (3 mol), and the compound (II-4) is an ester compound derived from the compound represented by the formula (4-4) (1 mol) and 1,2-naphtoquinonediazide-5-sulfonic acid (2 mol).

[Chemical Formula 10]

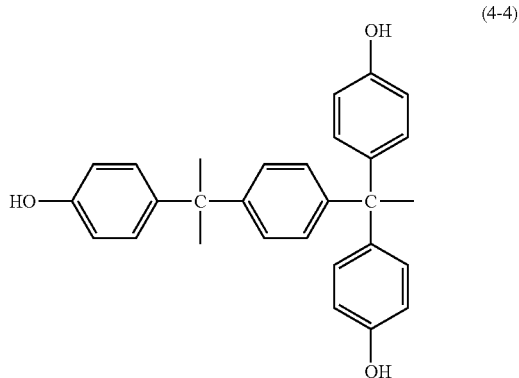

(4-4)

TABLE 3

| | Condition of resist | Surface condition | Film reduction | Sensitivity | Resolution |
|---|---|---|---|---|---|
| Example 1 | resist solution | — | A | A | A |
| | DF | A | A | A | A |
| Example 2 | DF | A | A | A | A |
| Example 3 | DF | A | A | A | A |

TABLE 2

| | Vinyl-based polymer (I) solution/ novolac resin | | Component (II) | | | | Component (III) | | MEK |
|---|---|---|---|---|---|---|---|---|---|
| | type of polymer | parts by mass | (II-1) parts by mass | (II-2) parts by mass | (II-3) parts by mass | (II-4) parts by mass | (5-1) parts by mass | (5-2) parts by mass | parts by mass |
| Example 1 | (I-1) | 100 | 10 | — | — | — | 2 | — | 200 |
| Example 2 | (I-2) | 100 | 10 | — | — | — | 2 | — | 200 |
| Example 3 | (I-1) | 100 | — | 10 | — | — | 2 | — | 200 |
| Example 4 | (I-1) | 100 | 10 | — | — | — | 1 | — | 200 |
| Example 5 | (I-1) | 100 | 10 | — | — | — | 5 | — | 200 |
| Example 6 | (I-1) | 100 | 10 | — | — | — | 10 | — | 200 |
| Example 7 | (I-1) | 100 | — | — | 10 | — | 2 | — | 200 |
| Example 8 | (I-1) | 100 | — | — | — | 10 | 2 | — | 200 |
| Example 9 | (I-1) | 100 | 10 | — | — | — | — | 2 | 200 |
| Comparative Example 1 | (I-1) | 100 | 10 | — | — | — | 0 | — | 200 |
| Comparative Example 2 | (I-3) | 100 | 10 | — | — | — | 2 | — | 200 |
| Comparative Example 3 | (I-4) | 100 | 10 | — | — | — | 2 | — | 200 |
| Comparative Example 4 | novolac | 100 | 10 | — | — | — | 2 | — | 200 |

TABLE 3-continued

|  | Condition of resist | Surface condition | Film reduction | Sensitivity | Resolution |
|---|---|---|---|---|---|
| Example 4 | DF | A | A | A | B |
| Example 5 | DF | A | B | A | A |
| Example 6 | DF | A | C | A | A |
| Example 7 | DF | A | A | A | A |
| Example 8 | DF | A | A | B | C |
| Example 9 | DF | A | A | A | A |
| Comparative Example 1 | DF | A | A | B | D |
| Comparative Example 2 | DF | A | A | A | D |
| Comparative Example 3 | DF | A | A | C | D |
| Comparative Example 4 | DF | B | — | — | — |

In the table, the "resist solution" indicates that the resist film directly formed from the resist solution was evaluated, "DF" indicates that the resist film formed through a dry film was evaluated.

In Comparative Example 1, because it did not contain a specific compound (III), the resolution was insufficient.

In Example 8, because the ester compound derived from a aromatic polyhydroxy compound having four aromatic rings and at least one compound selected from the group consisting of 1,2-naphthoquinonediazide-5-sulfonic acid and 1,2-naphthoquinonediazide-4-sulfonic acid, was used as a quinonediazide compound (II), sensitivity and resolution were slightly declined.

In Comparative Example 2, because the monomer (a) having a phenolic hydroxyl group was not used, the resolution was insufficient.

In Comparative Example 3, because the carboxyl group containing vinyl-based monomer (b) was not used, sensitivity and resolution were insufficient.

In Comparative Example 4, because a novolac resin was used, cracks occurred.

INDUSTRIAL APPLICABILITY

The photosensitive resin composition of the present invention, it is useful as a resist in the case of manufacturing a chip-on-film (COF) and a multilayer printed wiring board obtained by the build-up method.

The invention claimed is:

1. A photosensitive resin composition comprising:
a vinyl-based copolymer (I) obtained by polymerizing a monomer mixture containing a monomer (a) having a phenolic hydroxyl group and a carboxyl group-containing vinyl monomer (b);
a quinonediazide compound (II); and
a compound (III) represented by the following formula (5)

[Chemical Formula 1]

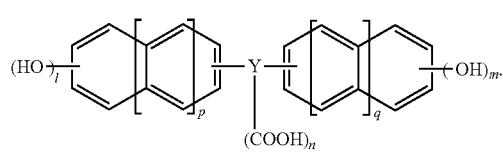

(5)

In the formula, Y is a straight or branched hydrocarbon group of 1 to 6 carbon atoms; l and m are respectively independently an integer of 1 to 3; n is 1 or 2; p and q are respectively independently 0 or 1.

2. The photosensitive resin composition according to claim 1, wherein the compound (III) is at least one compound selected from the group consisting of compounds represented by the formula (5-1) and (5-2)

[Chemical Formula 2]

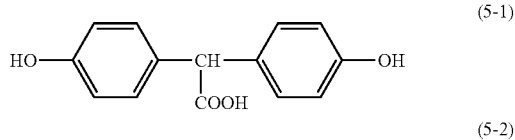

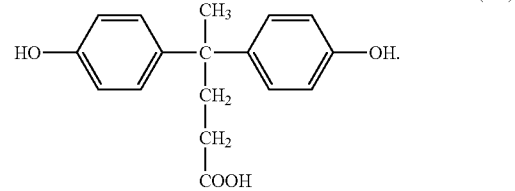

3. The photosensitive resin composition according to claim 1, wherein the content ratio of the compound (II) is 5 to 70 parts by mass, relative to 100 parts by mass of the vinyl-based copolymer (I), and the content ratio of the compound (III) is 0.5 to 10 parts by mass, relative to 100 parts by mass of the vinyl-based copolymer (I).

4. The photosensitive resin composition according to claim 1, wherein the quinonediazide compound (II) is an ester compound derived from a aromatic polyhydroxy compound having 1 to 3 aromatic rings and at least one compound selected from the group consisting of 1,2-naphthoquinonediazide-5-sulfonic acid and 1,2-naphthoquinonediazide-4-sulfonic acid.

5. The photosensitive resin composition according to claim 4, wherein the quinonediazide compound (II) is an ester compound derived from at least one compound selected from the group consisting of a compound represented by the following formula (4-1), a compound represented by the following formula (4-2), and a compound represented by the following formula (4-3) and at least one compound selected from the group consisting of 1,2-naphthoquinonediazide-5-sulfonic acid and 1,2-naphthoquinonediazide-4-sulfonic acid

[Chemical Formula 3]

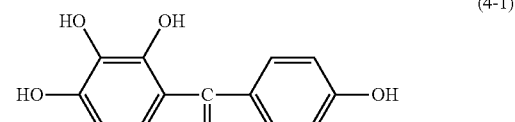

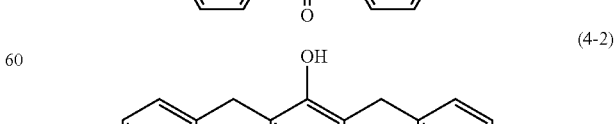

-continued

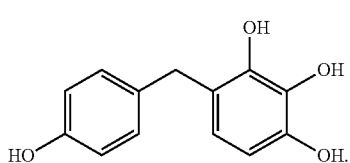
(4-3)

6. A photosensitive dry film composed from the photosensitive resin composition according to any one of claim 1 to 5 on the surface of a support film.

7. A method for forming a pattern comprising;
forming a resist film composed of the photosensitive resin composition according to any one of claim 1 to 5 on the surface of the substrate;
conducting exposure of the resist film to form a latent image;
developing the resist film in which the latent image is formed, using a developing solution having pH 10.5 to 12.5 to form a resist pattern.

* * * * *